United States Patent [19]

Grabbe

[11] Patent Number: 4,918,571

[45] Date of Patent: Apr. 17, 1990

[54] CHIP CARRIER WITH ENERGY STORAGE MEANS

[75] Inventor: Dimitry G. Grabbe, Middletown, Pa.

[73] Assignee: AMP Incorporated, Harrisburg, Pa.

[21] Appl. No.: 183,305

[22] Filed: Apr. 11, 1988

Related U.S. Application Data

[63] Continuation of Ser. No. 32,900, Mar. 31, 1987, abandoned.

[51] Int. Cl.[4] .............................................. H05K 7/20
[52] U.S. Cl. ................................. 361/386; 174/16.3; 357/81; 361/388
[58] Field of Search ............... 174/16.3; 361/386-389, 361/392-394; 357/81; 439/296, 325, 487, 632

[56] References Cited

U.S. PATENT DOCUMENTS

| | | | |
|---|---|---|---|
| 4,105,807 | 8/1978 | Arora | 427/126 |
| 4,268,102 | 5/1981 | Grabbe | 339/75 M |
| 4,349,238 | 9/1982 | Showman et al. | 339/75 M |
| 4,396,935 | 8/1983 | Schuck | 357/74 |
| 4,647,959 | 3/1987 | Smith | 357/74 |

FOREIGN PATENT DOCUMENTS

| | | |
|---|---|---|
| 3616494 | 11/1986 | Fed. Rep. of Germany . |
| 2529386 | 6/1982 | France . |
| 0133125 | 7/1984 | France . |
| 0188838 | 12/1985 | France . |

OTHER PUBLICATIONS

Patent Abstracts of Japan, vol. 8, 95 (E-242) (1532), 2 May 1984.
Atkinson et al., "Pluggable Storage Modules", IBM Technical Disclosure Bulletin, vol. 15, No. 11, Apr. 73, pp. 3408-3409.
"AMP Interconnecting Ideas"-pamphlet by AMP Incorporated.
Terminator-"Low Height Chip Carrier Socket: A Microelectronic Masterpiece", a booklet by AMP Incorporated.
"A Premolded Chip Carrier with Compliant Leads" by Dimitry Grabbe, AMP Incorporated, presented to Nepcon '77.

Primary Examiner—A. D. Pellinen
Assistant Examiner—Gregory D. Thompson
Attorney, Agent, or Firm—Bruce J. Wolstoncroft

[57] ABSTRACT

The invention is directed to a socketable chip carrier (2) for use with integrated circuits (22) having large lead counts. Due to the large lead counts, many leads may switch simultaneously, resulting in an instantaneous requirement for a great deal of power. The steady power supplies required for proper operation of the integrated circuits (22) cannot accommodate this requirement for increased power. Consequently, energy storage means (38) are provided in openings proximate the integrated circuit (22) to insure that an adequate power supply is maintained during switching. These energy storage means (38), such as capacitors (38) and/or batteries, supply the power required during the simultaneous switching. The capacitors (38) and/or batteries are electrically connected to the integrated circuit (22) by conductors (66) on a printed circuit (56). This type of configuration eliminates undesirable properties such as high resistance and inductance which can result in unwanted voltage drops and time delays respectively.

16 Claims, 3 Drawing Sheets

CHIP CARRIER WITH ENERGY STORAGE MEANS

This application is a Continuation of Application Ser. No. 032,900 filed March 31, 1987, now abandoned.

FIELD OF THE INVENTION

This invention relates to a chip carrier for use with integrated circuits having a large number of leads associate therewith. In particular, the invention relates to a chip carrier that has energy storage means proximate the integrated circuit.

BACKGROUND OF THE INVENTION

Large Scale Integration (LSI) Packages are utilized in systems which require high speed operation, with rise times less than ½ a nanosecond. The operational parameters of these systems requires the use of transmission line interconnection all the way onto the chip, as well as a very steady power supply. The requirements are due to the fact that a LSI package may have anywhere from 120 to 600 leads, with a large number of the leads switching simultaneously. When this switching occurs, the instantaneous requirement for power is great. Conventional leads of a package cannot provide the necessary current without a measurable voltage drop. This is due to the inductance and resistance of the conventional leads.

In order to prevent the problem of voltage drop, it is customary to mount capacitors in the immediate vicinity of the chip. These capacitors act as energy storage devices which supply the power required during the simultaneous switching.

One commercially available method of providing capacitors in the vicinity of the chip is to incorporate capacitors or the like into the body of a multi-layer ceramic package. However, these multi-layered packages are costly to manufacture and have problems associated therewith. The process of manufacture requires the use of materials such as tungsten or molybdenum applied in very thin layers of the multi-layered package. These thin layers of tungsten, etc. exhibit the undesirable properties of high resistance and inductance, which can cause unwanted voltage drops and time delays respectively.

SUMMARY OF INVENTION

An object of the present invention is to provide a chip carrier which can accommodate large scale integration chips or integrated circuits and the power requirements associated therewith, without encountering the undesirable properties of high resistance and inductance found in the prior art. As the possibility of simultaneously switching numerous leads of the integrated circuit is significant, the chip carrier must have energy storage means which are provided proximate the integrated circuit. These energy storage means supply the power that is required during the simultaneous switching of the leads. The configuration of the chip carrier allows the required power to be supplied without the undesirable properties of high resistance and inductance.

The present invention is an electrical component of the type used to interconnect integrated circuits having large numbers of leads extending therefrom to a substrate. The electrical component comprises a housing means which has heat sink means, conductor means, and spacer means.

The heat sink means has an upper surface with increased surface area, the increased surface area is provided to enable the heat sink means to better dissipate heat. A bottom surface of the heat sink means has recesses and an integrated circuit receiving zone positioned thereon. The recesses being positioned proximate the integrated circuit receiving zone.

The conductor means has conductors positioned thereon. Respective conductor leads electrically engage respective pads of the integrated circuit. An opening is provided in the conductor means, the opening extends from a first surface of the conductor means, through a second surface.

The spacer means has an upper surface which cooperates with the bottom surface of the heat sink means, a lower surface of the spacer means cooperates with the conductor means, the spacer means being dimensioned with essentially the same thickness as that of the integrated circuit. The dimensions of the spacer means insures that the respective leads of the conductor means are positioned in the same plane as the respective pads of the integrated circuit. Openings extend through the spacer means, such that respective openings of the spacer means are in alignment with the recesses and the integrated circuit receiving zone of the heat sink means. Also, the opening of the conductor means is in alignment with a respective opening of the spacer means and with the integrated circuit receiving zone of the heat sink means.

The integrated circuit is positioned on the integrated circuit receiving zone and extends through the respective opening in the spacer means and the opening in the conductor means. The pads of the integrated circuit are electrically engaged with the leads of the conductor means.

Energy storage means are positioned proximate the integrated circuit receiving zone. The energy storage means are secured to respective conductors of the conductor means and extend therefrom through respective openings of the spacer means, into the recesses of the heat sink means. This ensures that during the operation of the integrated circuit, numerous leads of the integrated circuit can be switched simultaneously without failure due to voltage drop. The energy storage means cooperates with the system power supply to provide the power required for effective operation of the integrated circuit. The storage means may be, but are not limited to, capacitors and rechargeable batteries.

BRIEF DESCRIPTION OF THE DRAWINGS

FIG. 4 a diagrammatic view of an enlarged fragmentary section of a printed circuit of the chip carrier.

FIG. 5 is a diagrammatic view of an enlarged fragmentary section of an alternative embodiment of the present invention.

DETAILED DESCRIPTION OF THE INVENTION

Figure 1:
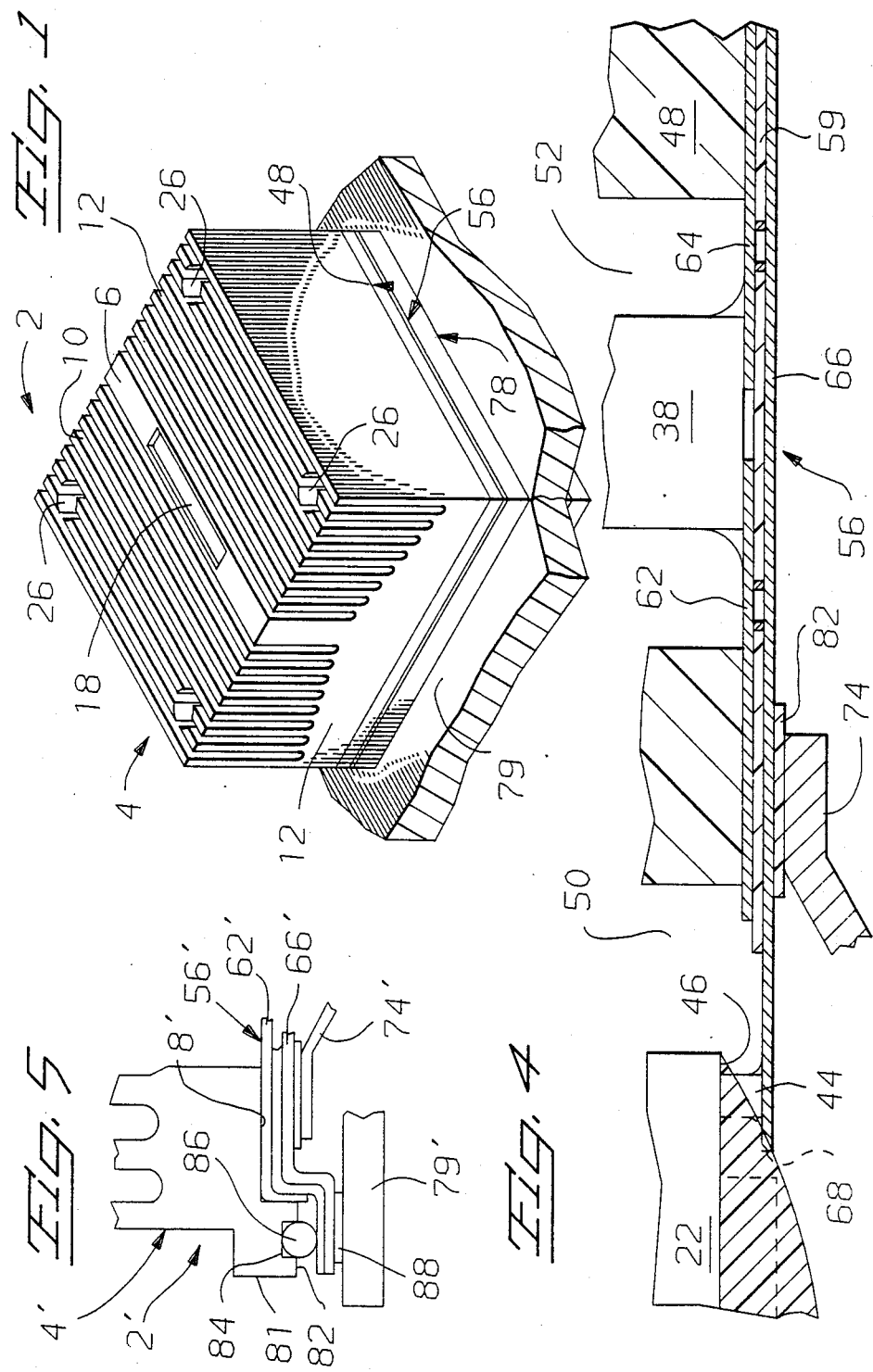
FIG. 1 is a perspective view of a chip carrier of the present invention.

A chip carrier 2, for use with integrated circuits 22 having large lead or pad counts, has capacitors 38 and a heat sink 4 integral therewith. This arrangement provides the power required by integrated circuit 22 as a large number of pads 44, of which 120 to 600 can be present, switch simultaneously. When this simultaneous switching occurs, the instantaneous requirement for the power to provide the necessary current to integrated circuit 22 without a measurable voltage drop is satisfied by the use of capacitors 38 provided proximate integrated circuit 22.

As shown in FIG. 1, heat sink 4 is provided as an integral part of chip carrier 2, and extends from an upper surface 6 to a lower surface 8. Upper surface 6 has a plurality of spaced apart as heat shown in FIG. 2, channels 10 extending therefrom. Channels 10 extend between sidewalls 12, with walls 16 of each respective channel 10 being essentially parallel with walls of each other channel 10. Walls 16 of channels 10 are essentially perpendicular to side walls 12. As shown in the FIGS. 2 and 3, outside channels 10a, those nearest sideswalls 12, extend down toward bottom surface 8 further than inside channels 10b, with each intermediate channel 10c being stepped accordingly. This configuration allows for good heat dissipation. However, other configurations of upper surface 6 may be used in heat sink 4.

Figure 2:
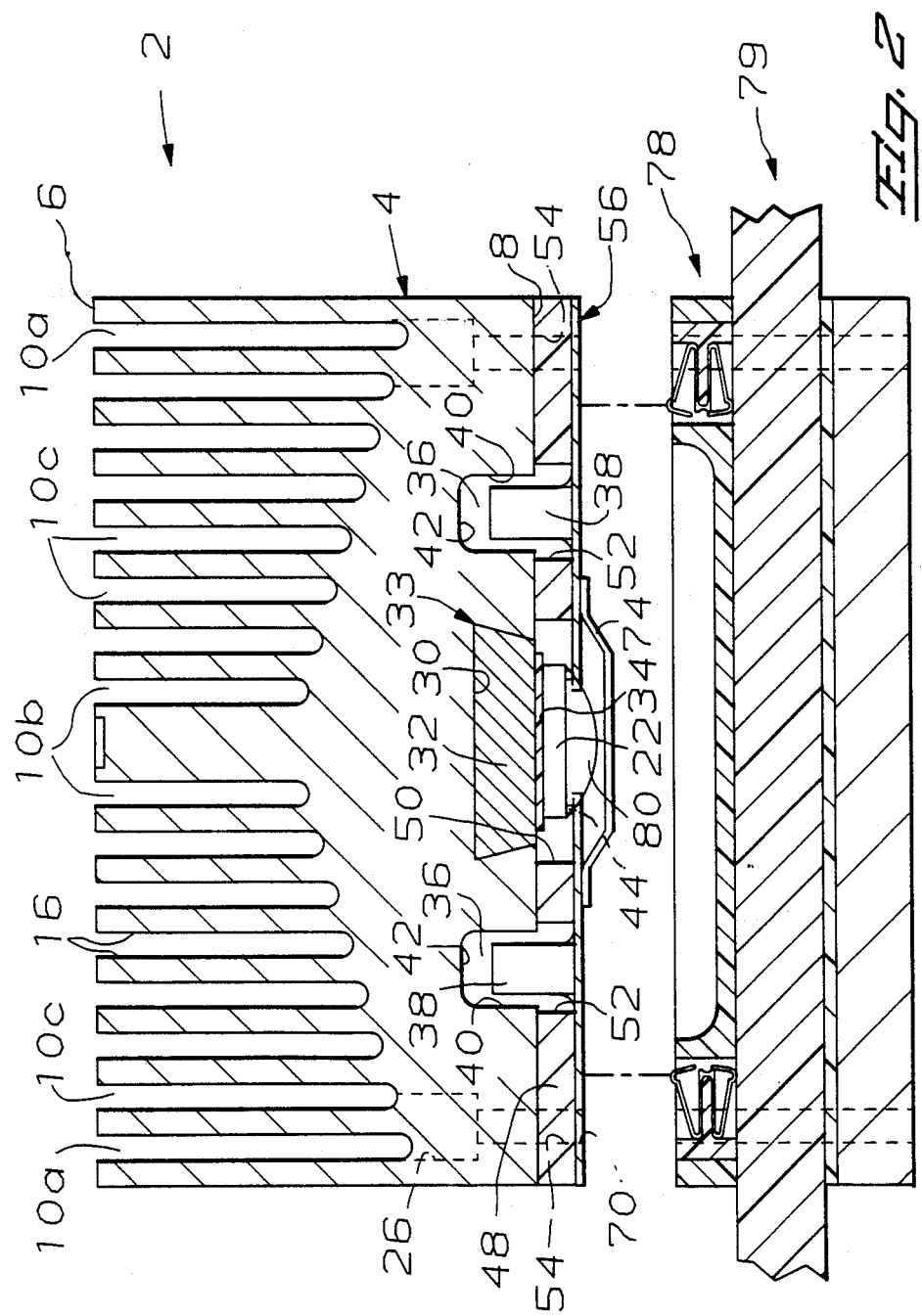
FIG. 2 is a cross-sectional view of the chip carrier showing the chip carrier prior to engagement with a chip carrier socket positioned on a substrate.

As shown in FIG. 2, a recess zone 18 is positioned between inside channels 10b of heat sink 4 in upper surface 6 of heat sink 4. Recess 18 is provided to allow identification numbers to be stamped thereon.

Proximate each corner of heat sink 4 are provided mounting openings 26. Openings 26 extend through heat sink 4 and cooperate with screws 28 or the like, as will be discussed.

Heat sink 4 is manufactured from metal or some other substance having the desired heat transferring properties required for proper operation of integrated circuit 22. Channels 10 allow the flow of air or other substances across the exposed surfaces, thereby dissipatig the heat. Heat sinks of this type are well known in the industry and it is, therefore, deemed unnecessary to go into greater detail concerning the operation of heat sink 4.

Lower surface 8 of heat sink 4 has a recess 30 provided therein. An intermediate material 32 is positioned in recess 30 and is secured to heat sink 4 by means of press fitting, brazing, insert casting, cementing, or other efficient heat transferring securing means. Recess 30 and intermediate material 32 are provided in the integrated circuit receiving zone 33. Intermediate material 32 has the special property of matching the coefficient of expansion of integrated circuit 22. One example of such a material is copper tungsten. Integrated circuit 22 is attached to intermediate material 32 by any of the standard processes now utilized for such purposes, such as, for example, silver epoxy, eutetic, ausn etc.

Heat sink 4 can be produced using many different processes, one of which is the "lost wax" casting process. This process is capable of reproducing very fine geometries economically. Using this process, the complete complex three dimensional shape, with the recesses and channels provided therein, can be produced in one step.

It should be noted that recess 30 and intermediate material 32 need not be provided. In the alternative, integrated circuit receiving zone 33 could be an area of lower surface 8 of heat sink 4, which is designated for integrated circuit 22 to be mounted thereon.

Integrated circuit 22 can be mounted, with silver epoxy or the like, directly onto integrated circuit receiving zone 33 if integrated circuit 22 can be in electrical engagement with heat sink 4. However, it is not always feasible to have integrated circuit 22 in electrical engagement with heat sink 4. In such cases, integrated circuit 22 must be separated from intermediate material 32 by a thin layer of some type of dielectric material 34 which has the heat flow characteristics required to allow the heat generated by integrated circuit 22 to be dissipated by heat sink 4. A thin film of diamond is an example of a highly heat conductive dielectric material 34 which can be used if integrated circuit 22 cannot be electrically engaged with heat sink 4. Sputtered ceramic and Berilium Oxide are other examples.

On each side of recess 30, and spaced therefrom, are recesses 36 which cooperate with capacitors 38, as will be discussed. Recesses 36 are provided between side walls 12 of heat sink 4 and recess 30. Recess side walls 40 are essentially parallel to respective side walls 12 of heat sink 4, with top wall 42 of recess 36 being essentially parallel to the plane of upper surface 6 of heat sink 4.

As discussed above, integrated circuit 22 is mounted to intermediate material 32, such that pads 44 of integrated circuit 22 are positioned on a bottom surface 46 of integrated circuit 22, bottom surface 46 is spaced from lower surface 8 of heat sink 4. Consequently, in order to provide an easy manner of connecting pads 44 of integrated circuit 22 to other components, such as chip carrier socket 78, an insulating spacer 48 is provided. Insulating spacer 48 is produced from material having the desired insulating characteristics, such as, but not limited to, fiber glass. The width of insulating spacer 48 is essentially the same as the width of heat sink 4. Openings 50, 52 of insulating spacer 48 are provided for integrated circuit 22 and capacitors 38, respectively. Openings 50, 52 of insulating spacer 48 are in alignment with the corresponding recesses 30, 36 of heat sink 4. Insulating spacer 48 is secured to heat sink 4 by means of an epoxy or other bonding method known in the industry. Insulating spacer 48 also has mounting openings 54 which are in alignment with mounting openings 26 of heat sink 4.

The electrical connection of pads 44 of integrated circuit 22 to other components, such as contacts of chip carrier socket 78 which are in electrical engagement with a printed circuit board 79, is accomplished by a thin two sided printed circuit 56; as best shown in FIG. 4. The dielectric 59 of printed circuit 56 may be quite thin, such as for example 0.002 inches, for which flexible circuitry is well suited. Dielectric printed circuit 56 contains conductive power and ground zones 62,64 and conductors 66 on respective sides thereof. The top side of printed circuit 56 has zones 62, 64 of solid metal which provide a low resistance path for the power and ground current to travel across printed circuit 56 and which serve as a reference ground plane for signals flowing in the "microstrip" conductors 66. The bottom side of printed circuit 56 has narrow conductors 66 applied thereto. The inner ends of conductors 66 are connectd to pads 44 of integrated circuit 22, as required. This electrical connection can be accomplished by tape automated bonding (TAB), area array soldering, wire bonding or other similar methods. The outer ends of conductors 66 are connected to the next level of interconnections such as, for example, chip carrier socket 78. Zones 62, 64 and conductors 66 are dimensioned to provide the desired characteristic impedance across printed circuit 56. Printed circuit 56 is dimensioned to be the same size as bottom surface 8 of heat sink 4. An opening 68 extends through printed circuit 56, and is in alignment with recess 30 of heat sink 4 and opening 50 of insulating spacer 48. Mounting openings 70 in printed circuit 56 are also provided, and align with mounting openings 26, 54 of heat sink 4 and insulating spacer 48, respectively.

In order to insure quick, easy termination of pads 44 with conductors 66, pads 44 of integrated circuit 22 must be kept essentially coplanar with conductors 66 of printed circuit 56. Consequently, printed circuit 56 is attached to insulating spacer 48 by an epoxy or the like in order to maintain the proper spacing between heat sink 4 and printed circuit 56.

Decoupling capacitors 38 are provided in recesses 36 of heat sink 4 and in openings 52 of insulating spacer 48, as shown in FIG. 2. Capacitors 38 are attached to the top side of printed circuit 56 by means of soldering or other conventional means such as silver epoxy. The power and ground zones 62, 64 of printed circuit 56 are bridged by capacitors 38, thus providing an extremely low resistance and an immediate source of power during switching.

Figure 3:
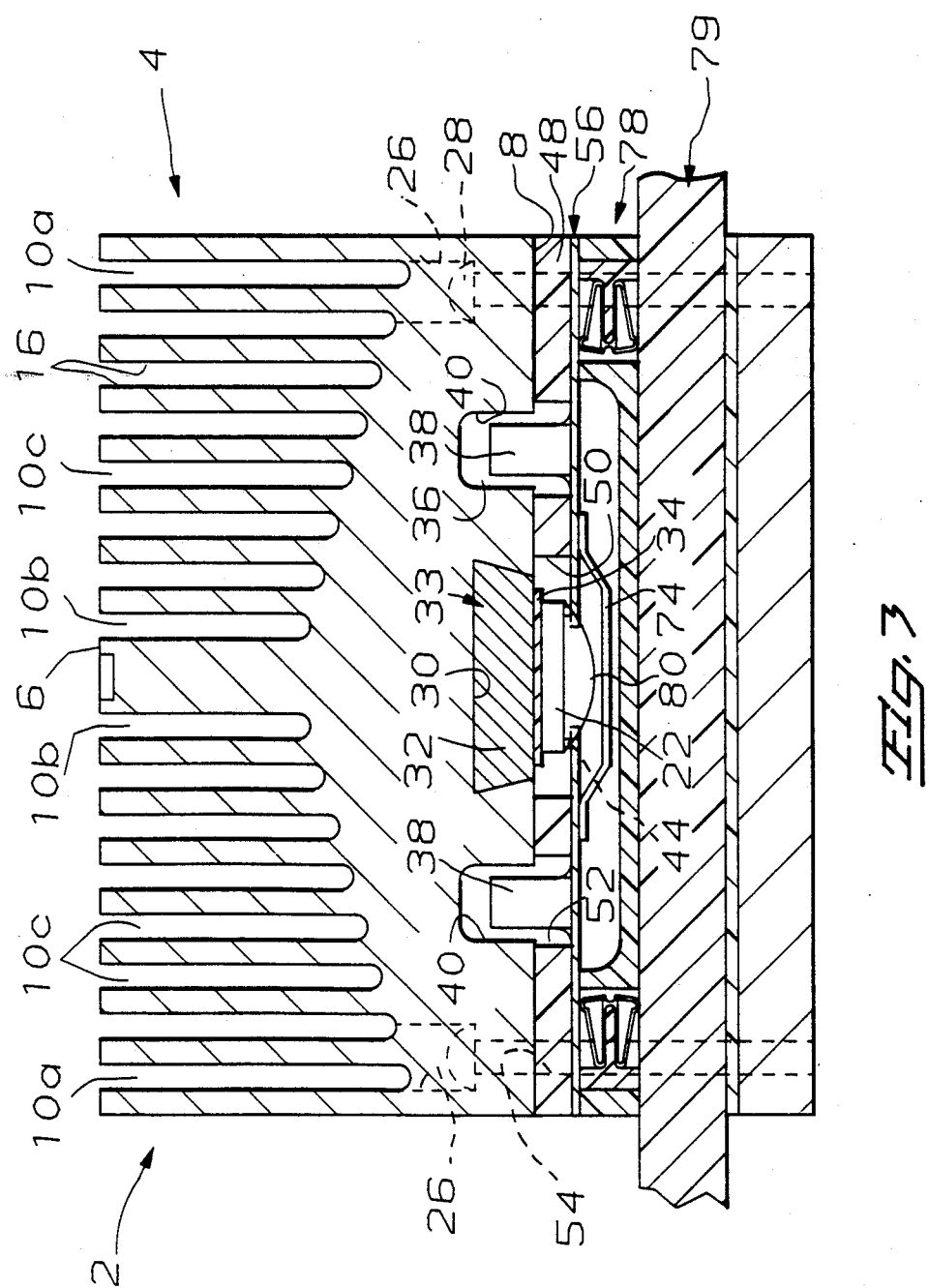
FIG. 3 is a cross-sectional view similar to that of FIG. 2, showing the chip carrier after it has been brought into electrical engagement with the chip carrier socket.

In the alternative, rechargeable batteries 39, as shown in FIG. 3, may be provided in place of or in cooperation with capacitors 38. The batteries would be attached in the same manner as described above, and operate in essentially the same way as capacitors 38. A silver-zinc battery is one example of the type which may be used.

In those areas where necessary, plated through holes 63 connect the voltage or ground zones 62, 64 of the top side to conductors 66 on the bottom side, such that zones 62, 64 provide the path for power and ground connections to integrated circuit 22. This also provides shielding between signal leads when required. The plated through holes must be positioned a given distance from each other in order to provide a required Standing Wave Ratio, such that radiation, and thus, crosstalk, is minimized.

In order to protect integrated circuit 22 from moisture, a material such as silicon nitride or other insulating incapsulant 80 is placed on bottom surface 46 of integrated circuit 22. Also, to further protect integrated circuit 22, a protective shield 74 is attached over integrated circuit 22, as shown in FIGS. 2 through 4. As shown in FIG. 4, protective shield 74 is mounted to a dielectric 82 which is mounted to conductors 66.

For integrated circuit 22 to be placed in operation, conductors 66 must make electrical connection with the contacts or terminals of socket 78 or the like. In order to insure that a positive electrical connection is affected between socket 78 and conductors 66 of chip carrier 2, screws 28 cooperate with the mounting holes of chip carrier 2 and socket 78 to provide a positive connection therebetween. Socket 78, shown in FIGS. 2 and 3, is of the type disclosed in co-pending U.S. Application No. 891,170.

It should be noted that it is not necessary to use socket 78 to place integrated circuit 22 in operation. FIG. 5 shows one alternative embodiment for mounting the chip carrier to the printed circuit board. The reference numbers used in this description will be identical to those above, when appropriate, with the exception that prime marks will be used.

Heat sink 4' has projections 81 extending from opposite sides thereof. FIG. 5 shows only one side of heat sink 4' and therefor, only one side will be described, as the opposed side is identical in shape and function. Projection 81 extends from proximate lower surface 8' of heat sink 4', with a bottom surface 82 of projection 81 positioned below lower surface 8' of heat sink 4'. A recess 84 is provided in bottom surface 82, the recess cooperatig with a rubber "0" ring 86 to maintain ring 86 in position. Printed circuit 56' is shaped to correspond to the respective surfaces of heat sink 4' and projection 81. In other words, an inside portion of printed circuit 56' is proximate and parallel to lower surface 8' of heat sink 4' and an outside portion of printed circuit 56' is proximate and parallel to bottom surface 82 of projection 81. However, ground plane 62' of printed circuit 56' does not extend to the outside portion of printed circuit 56' due to the fact that printed circuit board 79' has a grounding plane located therein. The grounding plane of printed circuit board 79' is sufficient to serve as a reference.

In this embodiment, conductors 66' of printed circuit board 56' are maintained in electrical engagement with printed circuit board pads 88 by ring 86. Ring 86 is compressed between printed circuit 56' and bottom surface 82 as chip carrier 2' is secured to and electrically connected with printed circuit board 79'. The force exerted by ring 86 on printed circuit 56' insures that conductors 66' of printed circuit 56' will make and maintain electrical engagement with padds 88 of circuit board 79'. This provides the electrical path required to place the integrated circuit in operation.

A second alternative embodiment for mounting the chip carrier to the printed circuit board is similar to the first alternative embodiment described above, with the exception that the projections and rings are not provided. The shape of the printed circuit remains essentially the same as shown in FIG. 5. However, as the projections and the rings are not provided, the conductors of the printed circuit must be soldered to the pads of the printed circuit board.

With chip carrier 2 properly installed on socket 78 or the like, the appropriate operation is performed on integrated circuit 22. As previously stated, during operation of integrated circuit 22, many signals have the possibility of switching at the same time. The instantaneous requirement for the power to provide the necessary current without a measurable voltage drop frequently cannot be satisfied by the conventional terminals of socket 78 due to the inductance and resistance of such terminals. Therefore, it is necessary to mount capacitors 38, which act as energy storage units, in the immediate vicinity of integrated circuit 22.

An additional advantage of chip carrier 2 is that if integrated circuit 22 fails for any reason, heat sink 4 is salvageable. The bad integrated circuit and plastic are ground off, leaving nothing but the heat sink, which is reusable. This process can be repeated several times with the heat sink maintaining its desired characteristics. This is of interest, because the heat sink represents a large portion of the cost of the chip carrier.

The configuration of the socket provides the required energy storage in the immediate vicinity of the chip, thereby enabling the required voltage level to be maintained as many of the leads are switched simultaneously. These sockets are not as costly to manufacture as multi-layered ceramic packages. Also, the chip carrier of this invention avoids many of the problems associated with multi-layered ceramic packages. As thin layers of tungsten or the like are not required, the undesirable properties of high resistance and inductance are avoided, thereby avoiding unwanted voltage drops and time delays, respectively.

I claim:

1. An electrical component of the type used to interconnect an integrated circuit having pads or the like to a substrate, the electrical component comprising:
   a housing means having heat sink means, conductor means and spacer means;
   the heat sink means having a top surface and a bottom surface, the bottom surface having recesses and an integrated circuit receiving zone positioned thereon, the top surface of the heat sink means configured to dissipate heat efficiently, insuring that the integrated circuit remains within given operating temperatures;
   the conductor means having conductors thereon, respective conductors electrically engage respective pads of the integrated circuit, the conductor means having a first opening extending therethrough;
   the spacer means having an upper surface which cooperates with the bottom surface of the heat sink means and a lower surface which cooperates with the conductor means, the spacer means being dimensioned with essentially the same thickness as the integrated circuit, second and third openings extend through the spacer means, respective second openings of the spacer means align with the recesses of the heat sink means, and the first opening of the conductor means aligns with the integrated circuit receiving zone of the heat sink means and a respective third opening of the spacer means;
   The integrated circuit secured to the integrated circuit receiving zone, such that the integrated circuit extends into the respective third opening in the spacer means and is in substantial alignment with the first opening in the conductor means;
   energy storage means positioned proximate the integrated circuit, the energy storage means being secured to respective conductors of the conductor means and extending through the second openings of the spacer means, into the recesses of the heat sink means;
   whereby during the operation of the integrated circuit, numerous pads of the integrated circuit can be switched simultaneously requiring a large instantaneous power supply, causing the energy storage means to supply the power required for effective operation.

2. An electrical component as recited in claim 1 wherein the integrated circuit receiving zone has a recess located therein, the recess having an intermediate material therein, the intermediate material is secured to the heat sink means, and the integrated circuit mounted to the intermediate material, the intermediate material having the desired characteristic coefficient of expansion, which matches that of the integrated circuit, and the desired heat flow characteristics.

3. An electrical component as recited in claim 2 wherein a thin layer of dielectric material is provided between the integrated circuit and the integrated circuit receiving zone, the dielectric material having the appropriate heat flow characteristics.

4. An electrical component as recited in claim 1 wherein the conductor means is a printed circuit having conductors on a top and a bottom surface thereof.

5. An electrical component as recited in claim 4 wherein the printed circuit has voltage and ground conductive zones on a respective surface thereof and signal conductors on a surface which is opposed to the surface with the voltage and ground zones located thereon.

6. An electrical component as recited in claim 5 wherein through holes are provided on the printed circuit, enabling the voltage and ground zones to be electrically engaged with respective signal conductors, such that a path is provided for the power and ground connections to the integrated circuit and to provide for shielding between signal leads.

7. An electrical component as recited in claim 1 wherein the spacer means is an insulating spacer made from dielectric material, the insulating spacer is provided to space the signal conductors of the conductor means from the bottom surface of the heat sink means, such that the pads of the integrated circuit will be positioned in the same plane as the signal conductors of the conductor means, thereby insuring that the signal conductors can be easily terminated to the pads of the integrated circuit.

8. An electrical component as recited in claim 1 wherein the energy storage means are decoupling capacitors which straddle the conductors on the conductor means, such that as a large number of the pads of the integrated circuit are switched at the same time, the capacitors provide the power required for effective operation, as the instantaneous requirement for power cannot be satisfied by conventional leads of a socket.

9. An electrical component as recited in claim 1 wherein the energy storage means are rechargeable batteries which straddle the conductors on the conductor means, such that as a large number of the pads of the integrated circuit are switched at the same time, the batteries provide the power required for effective operation, as the instantaneous requirement for power cannot be satisfield by conventional leads of a socket.

10. An electrical component as recited in claim 1 wherein the energy storage means comprise decoupling capacitors and rechargeable batteries, the energy storage means straddle the conductors on the conductor means, such that as a large number of the pads of the integrated circuit are switched at the same time, the capacitors cooperate with the batteries to provide the power required for effective operation, as the instantaneous requirement for powrr cannot be satisfied by conventional leads of a socket.

11. An electrical component of the type used to interconnect an integrated circuit to a substrate, the electrical component comprising:
   heat sink means having a substantially planar bottom surface, said bottom surface having an integrated circuit attached thereto, said heat sink means configured to dissipate heat efficiently, insuring that the integrated circuit remains within the given operating temperatures;
   conductor means having conductors provided thereon, and wherein respective conductors electrically engage respective pads of the integrated circuit;
   spacer means for spacing said heat sink means from said conductor means, said spacer means having an upper surface which cooperates with said bottom surface of said heat sink means and a lower surface which cooperates with said conductor means, said spacer means having a thickness substantially the same as the integrated circuit and an opening into which the integrated circuit projects; and energy storage means for supplying power to the integrated circuit when numerous pads of the integrated circuit are switched simultaneously, said storage means positioned proximate the integrated circuit and secured to said conductor means, said storage means projecting into an opening in said spacer means.

12. An electrical component as recited in claim 11 wherein the conductor means is a printed circuit having conductors on a top and a bottom surface thereof.

13. An electrical component as recited in claim 12 wherein the printed circuit has voltage and ground conductor planes on a respective surface thereof and signal conductors on a surface which is opposed to the surface with the voltage and ground conductors located thereon.

14. An electrical component as recited in claim 11 wherein the spacer means is an insulating spacer made from dielectric material, the insulating spacer is provided to space the signal conductors of the conductor means from the bottom surface of the heat sink means, such that the pads of the integrated circuit will be positioned in the same plane as the signal conductors of the conductor means, thereby insuring that the signal conductors can be easily terminated to the pads of the integrated circuit.

15. An electrical component as recited in claim 11 wherein the energy storage means are decoupling capacitors which straddle the conductors on the conductor means, such that as a large number of the pads of the integrated circuit are switched at the same time, the capacitors provide the power required for effective operation, as the instantaneous requirement for power cannot be satisfied by conventional leads of the socket.

16. An electrical component as recited in claim 11 wherein the energy storage means are rechargeable batteries which straddle the conductors on the conductor means, such that as a large number of the pads of the integrated circuit are switched at the same time, the batteries provide the power required for effective operation, as the instantaneous requirement for power cannot be satisfied by conventional leads of a socket.

* * * * *